United States Patent [19]

Witter et al.

[11] Patent Number: 4,637,855

[45] Date of Patent: Jan. 20, 1987

[54] PROCESS FOR PRODUCING CRYSTALLINE SILICON SPHERES

[75] Inventors: David E. Witter, Richardson; Jules D. Levine, Dallas, both of Tex.

[73] Assignee: Texas Instruments Incorporated, Dallas, Tex.

[21] Appl. No.: 728,959

[22] Filed: Apr. 30, 1985

[51] Int. Cl.⁴ ............................................. C30B 00/00
[52] U.S. Cl. ........................ 156/616 R; 156/DIG. 64; 23/295 R
[58] Field of Search .......... 156/616 R, 624, DIG. 64, 156/DIG. 65, 621; 23/293 A, 295 G, 295 R; 423/348; 427/86; 264/144, 140, 15; 136/250

[56]  References Cited

U.S. PATENT DOCUMENTS

| 4,330,582 | 5/1982 | Lindmayer | 423/348 |
| 4,371,421 | 2/1983 | Fan et al. | 156/617 R |
| 4,479,847 | 10/1984 | McCaldin et al. | 156/624 |

FOREIGN PATENT DOCUMENTS 105624  8/1981  Japan ................................ 156/621

Primary Examiner—Hiram H. Bernstein
Attorney, Agent, or Firm—Carlton H. Hoel; James T. Comfort; Melvin Sharp

[57]  ABSTRACT

In one embodiment of the present invention, silicon spheres are fabricated by applying a slurry of metallurgical grade silicon, or other suitable material, on the surface of a substrate capable of maintaining integrity beyond the melting point of silicon. The layer of metallurgical grade silicon is then patterned to provide regions of metallurgical grade silicon of uniform size. The substrate and metallurgical grade silicon are then heated beyond the melting point of silicon. The metallurgical grade silicon then beads to the surface as relatively pure silicon and forms silicon spheres due to the high cohesion of silicon. The structure is then cooled below the melting point of silicon and the silicon spheres then crystallize. The silicon spheres are then removed from the surface of the substrate and are further processed using techniques disclosed in copending U.S. patent application Ser. Nos. 647,551 and 647,578 to further purify the crystalline silicon spheres.

9 Claims, 4 Drawing Figures

PROCESS FOR PRODUCING CRYSTALLINE SILICON SPHERES

FIELD OF THE INVENTION

The present invention relates to the field of silicon processing and fabrication. More specifically, the present invention relates to a process for producing crystalline particles suitable for use in, for example, photovoltaic arrays.

BACKGROUND OF THE INVENTION

One method of producing photovoltaic arrays for the conversion of solar energy into electrical energy is to embed silicon particles in a matrix where the silicon particles have a outside coating of one conductivity type and an inside of an opposite conductivity type. Contact is made to the inside portion of the sphere on the back of the solar array and electrical energy is produced when photons of light strike the silicon particle and induce electrons to cross the depletion region between the two conductivity types. See Ralph, U.S. Pat. No. 3,025,335 entitled "Flexible Solar Energy Converter Panel", issued Feb. 29, 1962. As the solar array disclosed in Ralph was developed, it was determined that the optimum shape for the embedded silicon particles was spherical and that fabrication of the solar array was facilitated if the spherical silicon particles were of a uniform size.

Previous methods of fabricating silicon spheres of high purity and uniform size involved shotting of molten purified silicon out of a nozzle or out of a rotating disc. The spheres as formed in this manner are highly irregular in shape and polycrystalline. They can be made crystalline with the use of another process, involving heating of the material above the melting point. See Levine et al., U.S. Pat. No. 4,425,408, entitled "Production of Single Crystal Semiconductors", issued Jan. 10, 1984.

This sequence of shotting and remelting has the drawbacks that the silicon must be relatively pure and the sizing is irregular. An object of the present invention is to provide a method of producing silicon spheres of uniform size directly from low grade metallurgical silicon, thus providing a fabrication process for producing uniform silicon spheres at less cost than methods known in the prior art.

In addition, the prior art processes cannot produce spheres of sufficiently uniform size because of the difficulty of shotting the source silicon into particles of uniform volume.

SUMMARY OF THE INVENTION

In one embodiment of the present invention, silicon spheres are fabricated by applying a paste of metallurgical grade material which is highly cohesive in molten form, such as silicon, on the surface of a substrate capable of maintaining integrity beyond the melting point of the material. The layer of, for example, metallurgical grade silicon is patterned to provide regions of metallurgical grade silicon of uniform size. The substrate and metallurgical grade silicon are then heated beyond the melting point of silicon. The metallurgical grade silicon then beads to the surface as relatively pure silicon and forms silicon spheres due to the high cohesion of silicon. The structure is then cooled below the melting point of silicon and the silicon spheres then crystallize. The silicon spheres are then removed from the surface of the substrate and are further processed using techniques disclosed in copending U.S. patent application Ser. Nos. 647,551 and 647,578 to further purify the crystalline silicon spheres.

DETAILED DESCRIPTION

Figure 1A:
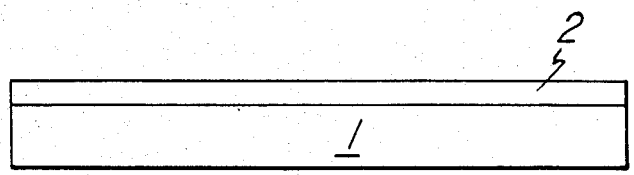
FIGS. 1A through 1D are schematic drawings depicting the processing steps necessary for one embodiment of the present invention.
Figure 1B:
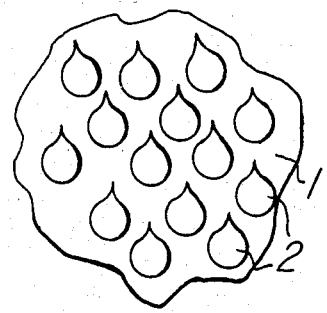

FIG. 1A is a side-view diagram of a component used in one embodiment of the present invention. The present embodiment is a process for forming spheres of crystalline silicon; however, it is understood that the present invention may be used to process other suitable materials. Substrate 1 may be composed of any material which remains rigid at temperatures capable of melting silicon, such as silicon carbide. Slurry layer 2 is a layer of paste applied to the surface of the substrate 1 which is composed of metallurgical grade silicon, which is a powder, in an appropriate liquid medium to form the slurry. Liquids which have been found suitable are water, isopropyl alcohol and alpha terpineol. The slurry is allowed to dry to form slurry layer 2. Slurry layer 2 is then patterned to provide selected areas of silicon slurry on the surface of substrate 1 as shown in FIG. 1B. Alternatively, slurry layer 2 may be patterned only in the top portion of slurry layer 2. In yet another method of providing a patterned slurry layer, slurry layer 2 is applied to substrate 1 using a silk screen printing process.

The pattern of slurry layer 2 in FIG. 1B is a series of tear-drop patterns. A tear-drop pattern is a preferred pattern because it provides one corner to each silicon slurry area. The silicon spheres tend to form at nucleation sites at the corners of the patterned silicon areas when the silicon slurry is formed using certain liquid media, such as water and isopropyl alcohol. The tear-drop pattern provides one corner for each patterned region at which the silicon sphere will nucleate or bead up. When the slurry is formed using alpha terpineol the silicon may form on the top surface of slurry layer 2.

Figure 1C:
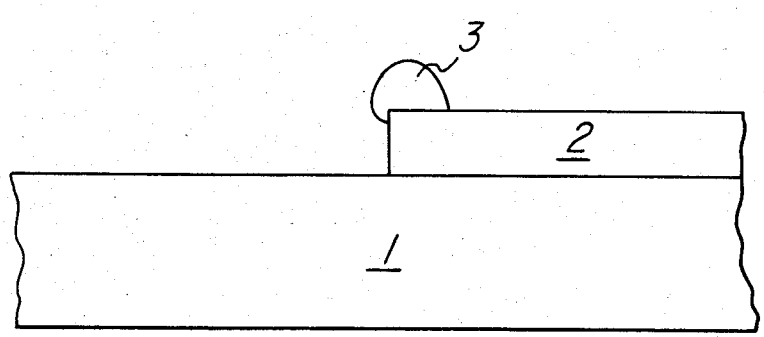
Figure 1D:
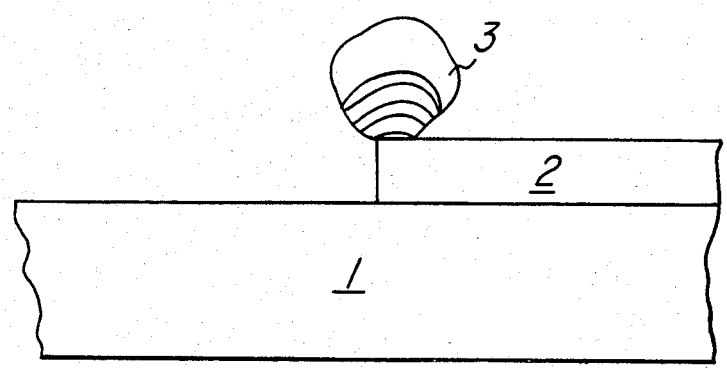
Figure 2:
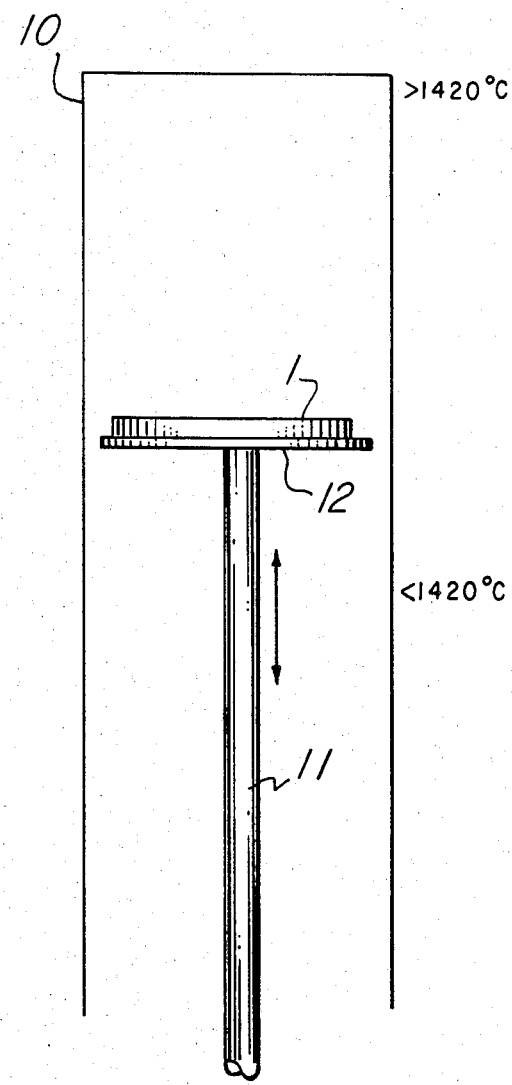

FIG. 1C is a side-view diagram of the corner of one tear drop pattern of silicon slurry layer 2 and substrate 1. At this point, the substrate and slurry area are heated to above 1410 degrees C. At this temperature, silicon begins to melt and, because of the high cohesiveness of molten silicon, it tends to bead on the surface of silicon slurry region 2. As the silicon beads to the surface, the silicon reacts with the furnace ambient, in this embodiment an oxidizing ambient, to form a silicon dioxide coating which acts as a "crucible" for the silicon sphere to prevent "wetting" of the surface of slurry layer 2. If the surface of slurry layer 2 is wetted by the silicon sphere, the sphere will collapse and form a hemispherical bead on the surface of slurry layer 2. When enough silicon has beaded up to the surface of silicon slurry region 2, substrate 1 is gradually cooled from the bottom surface so that silicon crystals form in silicon slurry region 2. These silicon crystals provide a crystal seed for molten silicon sphere 3. Heat is then dissipated through the bottom of silicon sphere 3 into slurry region 2 and through the substrate. As this occurs, the silicon at the base of silicon sphere 3 crystallizes and continues to crystallize in a radiating pattern as shown in FIG. 1D.

It is important that the silicon sphere is crystallized in this manner because molten silicon occupies a greater volume than crystalline silicon. Therefore, if silicon sphere 3 were cooled from the outside in, silicon sphere 3 would crack.

The size of the silicon spheres is dependent on the maximum temperature during beading and the size of the patterns of slurry layer 2. The greater the temperature, the larger the spheres. The size of the slurry patterns limits the size of the spheres by limiting the amount of silicon available as source silicon. Spheres have been formed that were approximately 17 mils in diameter, for instance. If the temperature across the surface of the substrate is uniform, very high uniformity of sphere size may be achieved. This feature is very important for the fabrication of photovoltaic arrays where particle size uniformity greatly facilitates several processing steps.

As stated above, this formation step of beading of silicon spheres is performed in an oxygen ambient thus providing a silicon sphere with a silicon dioxide coating (not shown) when the sphere is completely cooled. This oxide coating additionally helps getter impurities which are latent in metallurgical grade silicon and helps provide a pure crystalline silicon sphere. Most of the impurities remain in the silicon slurry layer 2, but some impurities are present in the spheres.

The spheres are removed from the surface of substrate 1 by physically knocking them loose and the silicon dioxide layer (not shown) is removed using techniques well known in the art thus removing the gettered impurities with it. The silicon spheres are then reheated to the melting point and recrystallized in an oxydizing ambient thus forming a new silicon dioxide layer and providing more uniform crystallization throughout this sphere. After the first step the crystalline silicon spheres often have slight crystallographic dislocations throughout the sphere. Most of these dislocations are removed in this remelting step. In addition, the new silicon dioxide layer (not shown) provides additional gettering to remove more impurities. Thus the silicon spheres are processed using techniques disclosed in copending U.S. patent application Ser. Nos. 647,551 and 647,578 to further purify the crystalline silicon spheres.

TECHNICAL ADVANTAGES

A process in accordance with the teachings of the present invention provides a method of converting metallurgical grade silicon directly to crystalline silicon spheres without forming silicon wafers by the usual method of shotting.

We claim:

1. A process for forming crystalline spheres of a crystallizable material, comprising the steps of:
    forming a layer of a paste of the crystallizable material on a planar surface of a substrate capable of withstanding temperatures in excess of the melting point of the crystallizable material;
    patterning said layer on the surface of said substrate;
    heating said patterned layer beyond the melting point of said crystallizable material and supplying an atmosphere which can react with said crystallizable material to form a coating that does not wet said layer thus causing said material to bead as coated spheres at the surface of said patterned layer;
    cooling said crystallizble material thus causing the beaded crystallizable material to crystallize into crystalline spheres; and
    removing said crystalline spheres from the surface of said patterned layer of crystallizable material.

2. A process as in claim 1 wherein said crystallizable material is silicon.

3. A process as in claim 1 wherein said substrate comprises silicon carbide.

4. A process as in claim 1 wherein said paste of crystallizable material is formed by depositing and patterning a slurry of crystallizable material using a silk screen process.

5. A process as in claim 1 wherein only the top surface of said layer of crystallizable material is patterned to provide nucleation sites.

6. A process as in claim 2 wherein said paste of silicon is formed on the surface of said substrate by mixing silicon powder and water, and applying the resulting compound to the surface of said substrate.

7. A process as in claim 2 wherein said paste of silicon is formed on the surface of said substrate by mixing silicon powder and isopropyl alcohol, and applying the resulting compound to the surface of said substrate.

8. A process as in claim 2 wherein said paste of silicon is formed on the surface of said substrate by mixing silicon powder and alpha terpineol, and applying the resulting compound to the surface of said substrate.

9. A process as in claim 2 wherein said patterning forms said layer into a plurality of approximately equal regions with each of said regions having a boundary with a single sharp corner for nucleation.

* * * * *